(12) United States Patent
Bernstein et al.

(10) Patent No.: US 6,311,310 B1
(45) Date of Patent: Oct. 30, 2001

(54) METHOD AND APPARATUS FOR WIRING INTEGRATED CIRCUITS WITH MULTIPLE POWER BUSES BASED ON PERFORMANCE

(75) Inventors: Kerry Bernstein, Underhill; John Joseph Ellis-Monaghan, Grand Isle; Norman Jay Rohrer, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/288,356

(22) Filed: Apr. 8, 1999

(51) Int. Cl.[7] ................................................. G06F 17/50
(52) U.S. Cl. ........................................ 716/2; 716/6
(58) Field of Search .............................. 716/2, 6

(56) References Cited

U.S. PATENT DOCUMENTS

| | | |
|---|---|---|
| 4,698,760 | 10/1987 | Lembach et al. ........................ 716/6 |
| 5,258,919 | 11/1993 | Yamanouchi et al. ................. 716/11 |
| 5,459,673 * | 10/1995 | Carmean et al. ......................... 716/6 |
| 5,638,290 | 6/1997 | Ginetti et al. ............................. 716/2 |
| 5,663,891 * | 9/1997 | Bamji et al. .............................. 716/2 |
| 5,751,593 | 5/1998 | Pullela et al. ............................. 716/6 |
| 5,764,525 | 6/1998 | Mahmood et al. ...................... 716/18 |
| 5,774,367 | 6/1998 | Reyes et al. .............................. 716/2 |
| 5,787,011 | 7/1998 | Ko .......................................... 716/2 |

* cited by examiner

Primary Examiner—Trong Phan
(74) Attorney, Agent, or Firm—Mark F. Chadurjian, Esq; McGinn & Gibb, PLLC

(57) ABSTRACT

A method and structure for designing a circuit, including identifying paths in the circuit not satisfying a preselected performance criteria, wherein identified paths are initially designed to be coupled to a first power supply, and redesigning the circuit such that the identified paths are coupled to a second power supply having a higher voltage than the first power supply. The higher voltage increases performance of the identified paths such that the identified paths satisfy the performance criteria.

19 Claims, 2 Drawing Sheets

METHOD AND APPARATUS FOR WIRING INTEGRATED CIRCUITS WITH MULTIPLE POWER BUSES BASED ON PERFORMANCE

BACKGROUND OF THE INVENTION

1. Field of the Invention

The present invention generally relates to a method and apparatus for circuit design (e.g., complementary metal oxide semiconductor (CMOS) circuit design) and to wiring integrated circuits (ICs), and more particularly to a method and apparatus for wiring ICs with multiple power buses based on performance.

2. Description of the Related Art

Conventional systems utilizing low power logic applications are growing rapidly as mobile communications (e.g., personal communications services, personal communication/data assistants, etc.) and pervasive computing become entrenched in modern society.

However, a dilemma faced by the integrated circuit (IC) designer is how to provide the computing performance to enable advanced features, such as voice recognition etc., while operating with a limited power supply (e.g., batteries). One solution is to provide high voltage power busing only for those circuits most critical for performance, and lower voltage power busing for less critical circuits.

However, this approach is problematic in that there is no method of determining how such power supplies should be optimally partitioned.

Further, there is a problem of crossing a low voltage logic path over to a path powered by higher voltages. Specifically, the problem is the inability of the lower output voltage to shutoff the transistor (e.g., PFET) load devices.

SUMMARY OF THE INVENTION

In view of the foregoing and other problems of the conventional systems and methods, an object of the present invention is to provide a structure and method for determining an optimal partitioning of a plurality of power supplies over an integrated circuit design.

Another object is to provide a circuit topology and method for overcoming the problem of crossing a low voltage logic path over to a path powered by higher voltages.

In a first aspect, a method according to the present invention for designing a circuit includes identifying paths in the circuit not satisfying preselected performance criteria, wherein identified paths are initially designed to be coupled to a first power supply, and redesigning the circuit such that the identified paths are coupled to a second power supply having a higher voltage than the first power supply, wherein the higher voltage is sufficient to increase performance of the identified paths such that they satisfy the performance criteria.

In a second aspect, an apparatus according to the present invention includes a plurality of devices, at least one of the devices having a first input and coupled to a first power supply for controlling an amount of current supplied to the apparatus from the first power supply, and a second input for receiving a signal from at least one low power signal path, the low power signal path coupled to a second power supply having a higher voltage than the first power supply, and wherein the at least one of the devices has an increased voltage threshold compared to others of the plurality of devices for minimizing an amount of current provided to the apparatus from the first power supply.

In another aspect of the invention, a method of optimizing performance and minimizing power dissipation of a plurality of integrated circuits, includes simulating the integrated circuits all wired with a first voltage power supply, identifying paths between the integrated circuits not meeting a delay margin criteria, wiring integrated circuits having paths not meeting the delay margin criteria with a second voltage power supply, determining and increasing a magnitude of load threshold voltages of all second voltage circuits having input signals emanating from first voltage bus circuits, re-simulating the integrated circuits and determining whether all logic paths meet delay margin criteria.

In other aspects of the invention, signal bearing media are provided for storing programs including the above-mentioned methods.

With the unique and unobvious structure and method of the present invention, performance can be optimized and power consumption can be minimized. Additionally, an efficient crossover of a low power voltage bus to a high power voltage bus may be performed.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
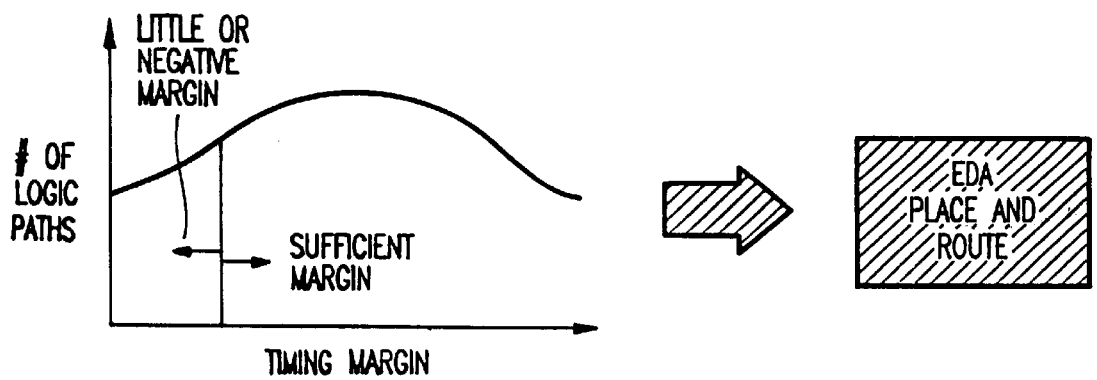
FIG. 1 is a histogram of timing margin for integrated circuit design.

Referring now to the drawings, and more particularly to FIGS. 1–4, a method, apparatus and signal bearing medium for storing a program of the method according to the present invention will be described for minimizing power consumption and optimizing performance.

In FIG. 1, a figure of merit used to characterize critical circuits in an integrated circuit is "Slack", which in the present application will be referred to as "Timing Margin" for the sake of clarity. "Timing Margin" is an excess amount of time available to a particular logic path before it fails. More simply and providing a real world analogy, the timing margin is the amount of time a train waits at a station before pulling out leaving anyone arriving at the station afterwards stranded. Today, timing margin is characterized for logic paths to ensure correct operation of the integrated chip, and a histogram depicts the distribution of circuits having relatively little margin as compared to less critical paths having more margin.

Paths with insufficient margin are redesigned to meet the timing margin criteria. A typical design has many non-critical paths, which are paths with a relatively great amount of timing margin. In FIG. 1, the histogram of the timing margin for an IC design is provided to an electronic design automation (EDA) place and route wiring tool(s) (e.g., a program module or the like).

Figure 2:
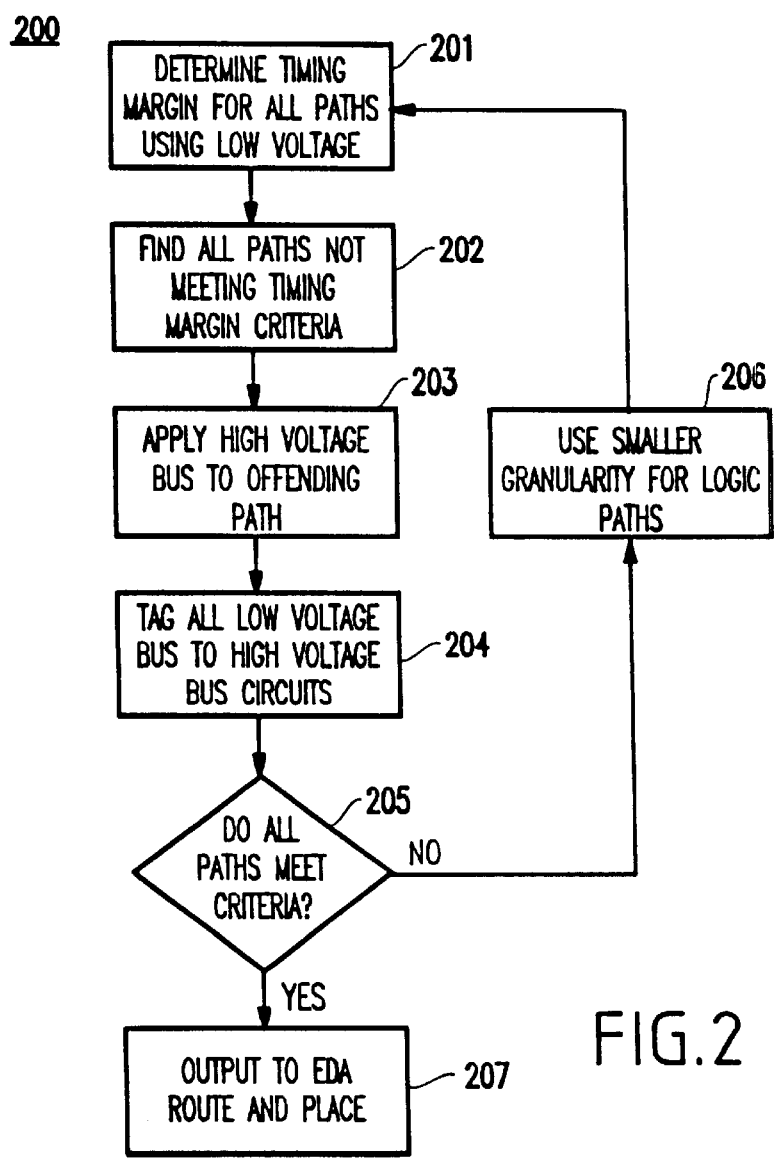
FIG. 2 is a flow diagram illustrating a method according to the present invention of finding and speeding up slow paths by applying a high voltage bus thereto.

A method according to the present invention for identifying critical paths requiring high voltage busing is illustrated in FIG. 2. Specifically, the flowchart of FIG. 2 finds and "speeds up" slow paths by applying a high voltage bus to the slow path(s).

It is noted that the method and algorithm of the present invention initiates the design by exclusively implementing the low voltage bus to ensure that the subject chip starts at the lowest possible power dissipation point.

Then, the higher voltage bus upgrades only those networks requiring the performance boost to achieve the desired performance. The effectiveness of this method depends on the granularity chosen for the logic paths. Hence, a smaller number of longer, more complicated paths will require a larger percentage of circuits on the chip with a high voltage supply. This is due to the inability to isolate the much smaller path count actually creating the longest delay.

Conversely, an integrated chip design using granularity with a large number of short logic paths will be more effective at isolating networks creating the longest delay. Thus, as is evident, the designer must make a trade-off in complexity in simulation and computer resources required.

Turning to FIG. 2, a method 200 is shown for finding and speeding up slow paths by applying the high voltage bus for a low voltage bus. First, in step 201, the circuit design is initiated by determining a timing margin for all paths utilizing a low voltage bus. As mentioned above, the low voltage bus is exclusively implemented to ensure that the subject chip starts at the lowest possible power dissipation point.

In step 202, all paths are found which do not meet the timing margin criteria through, for example, a comparison operation.

Then, in step 203, a higher voltage bus (e.g., higher voltage as compared to the lower voltage bus) is applied to all paths that fail the timing margin criteria. This step is implemented by a higher voltage bus which is a separate connection to a different power grid than the lower voltage power grid. Thus, the higher voltage bus begins upgrading only those paths/networks requiring the performance boost to achieve the desired performance.

In step 204, all low voltage busses are tagged to high voltage bus circuits. The inputs to all circuits connected to a high voltage bus are traced back to the driving circuits. Those inputs which come from a circuit connected to low voltage power buses are marked as crossover nets. All PFETs connected to a crossover net is converted to a high $V_t$ PFET in the schematic layout.

In step 205, it is determined whether all paths meet the power margin criteria through a comparison operation. If a "NO" results in step 205, the process proceeds to step 206, at which a smaller granularity is selected and used for the logic paths. The smaller granularity can be achieved by partitioning a custom circuit into smaller pieces so to prevent the larger circuit from being converted to a high power circuit. Another example would be partitioning a logic macro formed of standard cells into individual cells.

It is noted that the effectiveness of the inventive method depends on the granularity chosen for the logic paths. Once again, a smaller number of longer, more complicated paths will require a larger percentage of circuits on the chip with high voltage supply. Conversely, an integrated chip design using granularity with a large number of short logic paths will be more effective at isolating networks creating the longest delay. Thus, as mentioned, the designer makes a trade-off in complexity in simulation and computer resources required.

Finally, if a "YES" results in the determination of step 205, then in step 207 the design is output to the EDA Place and Route module. The EDA place and route tool connects the low power circuits to the low voltage power bus and the high power circuits to the high voltage power bus.

Thus, the present invention provides a method of optimizing performance and minimizing power dissipation of integrated circuits which includes simulating the ICs all being wired with a low voltage power supply, identifying those paths between the ICs not meeting a delay margin criteria, wiring those circuits not meeting the delay margin criteria with a high voltage power supply, determining and increasing the magnitude of the load (e.g., a P-type field effect transistor (PFET)) threshold voltages of all high voltage circuits having input signals emanating from low voltage bus circuits, re-simulating the integrated circuit and determining whether all logic paths meet power criteria, and if not meeting power criteria, then using finer granularity of logic paths to isolate slow circuit path(s) and repeating the above steps, and thereafter performing a logical-to-physical translation of the integrated circuit topology for the purpose of creating the high PFET load threshold adjust mask.

In another aspect of the present invention, the present invention provides for a crossover between a low voltage bus to a high voltage bus. As noted above, a problem of the conventional methods and structures is the inability of the lower output voltage to shutoff the PFET load devices.

The flow chart in FIG. 2 contains a step (e.g., step 204) which flags output nodes of low voltage circuits to high voltage circuits. Thus, high voltage gates fanning out from this low voltage output node are "tagged". During the EDA place and route, load devices (e.g., PFET load devices) are replaced with high threshold voltage PFET loads where, for example:

$$HV_{dd}-LV_{dd}=\Delta V_t \text{ and } V_{tcross}=V_t+\Delta V_t$$

It is noted that the magnitude of the high threshold PFET need not be increased exactly by the difference of the high power supply and low power supply. Designers can optimize the higher threshold at a position around the difference point.

Figure 3A:
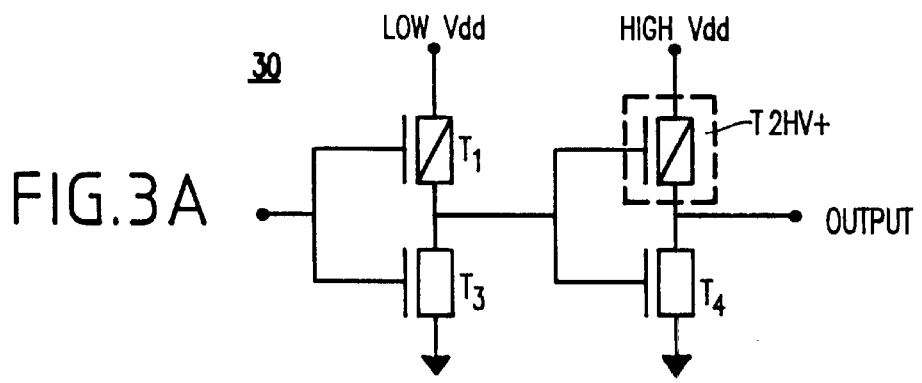
FIG. 3A is an example of a low-voltage-to-high-voltage crossover circuit according to the present invention.

An exemplary design of a low voltage-to-high voltage crossover circuit 30 is shown in FIG. 3A in which the output of the crossover circuit 30 swings between ground and Low $V_{dd}$, while the output of the next high voltage bus circuit swings between ground and high $V_{dd}$ as required. The circuit 30 includes low voltage transistor T1 (e.g., PFET) and transistor T3 (NFET), and a high voltage transistor (PFET) T2HVt and transistor T4 (NFET).

Then, the standby, or off current of this circuit is no greater than any other circuit on the chip. There is a performance penalty for the pull-up part of signal swing on the high voltage bus output, which is taken into account by the simulator when the chip is retimed. The larger Vt for the load PFET reduces the voltage overdrive and thus reduces the current. The timing rule for the circuit including T2HVt+T4, will have a slow output rise time.

Figure 3B:
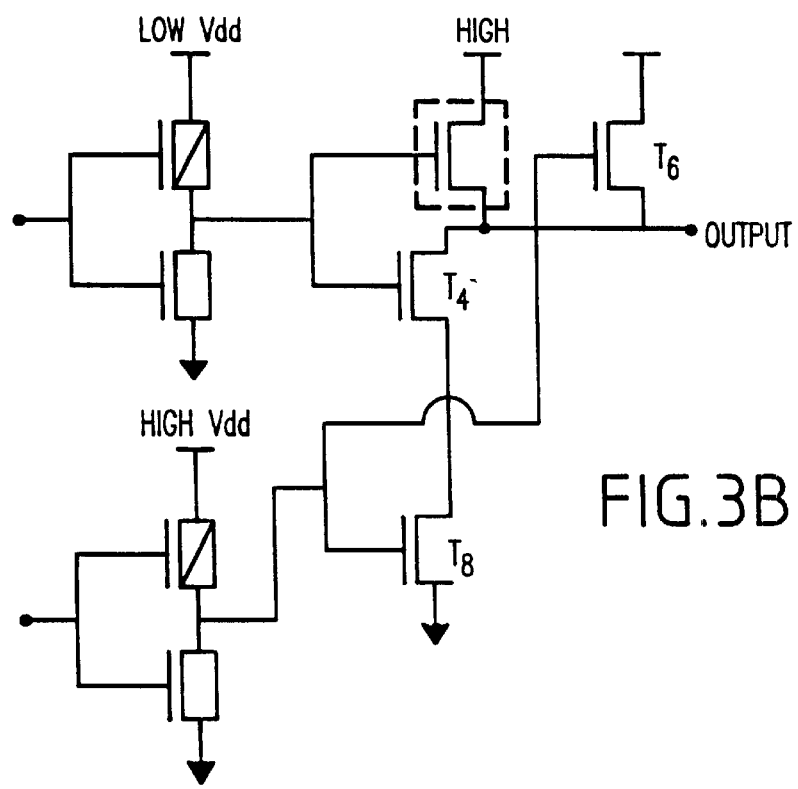
FIG. 3B illustrates another example of a low-voltage-to-high-voltage crossover circuit having three power supplies according to the present invention.
Figure 4:
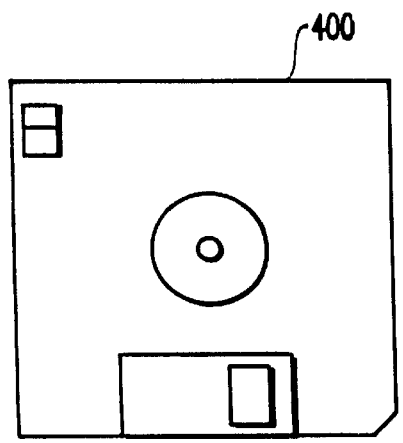
FIG. 4 illustrates a medium for storing a program for implementing the method according to the present invention.

Thus, in FIG. 3A, the simulator tags transistor T2 and renames it T2HVt. The threshold voltage of T2HVt is designed to be Vt+(High Vdd−Low Vdd). Such information is output and utilized by the place and route program in generating the threshold mask for the design. FIG. 3B illustrates an example of another crossover circuit structure having three power supplies and in which only one PFET is connected and in which NAND gate technology is employed in lieu of the inverter structure of FIG. 3A. Thus, an inverter of FIG. 3A can be replaced by (or used additionally with) a NAND gate, as shown in FIG. 3B. It is noted that not every PFET requires being converted to a high voltage. For example, as shown in FIG. 3, only a PFET connected to a low voltage bus needs to be converted to a high voltage. Thus, as evident from FIG. 3B, PFETs are shown having two inputs (e.g., one high Vdd and one low Vdd). Only the PFET connected to the low Vdd input requires conversion to a high Vt PFET (e.g., T2HVt PFET).

This method and the crossover circuit topology are not limited to only two power supplies and threshold voltages.

For example, the algorithm can use three power supplies, each having a different timing margin criteria for applying each power supply to a particular logic path. Generally, as timing margin increases, a lower power supply would be applied to that group of paths.

While the overall methodology of the invention is described above, the invention can be embodied in any number of different types of systems and executed in any number of different ways, as would be known by one ordinarily skilled in the art within the purview of the present invention.

Further, while the present invention has been described primarily in terms of software or software/hardware configuration, the same or similar functions could be implemented in a dedicated hardware arrangement.

In addition to the hardware/software environment described above, a different aspect of the invention includes a computer-implemented method for designing a circuit and for identifying critical paths requiring high voltage busing. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform a method of designing a circuit.

This signal-bearing media may include, for example, a random access memory (RAM) such as for example a fast-access storage contained within the computer. Alternatively, the instructions may be contained in another signal-bearing media, such as a magnetic data storage diskette 400 shown exemplarily in FIG. 4, directly or indirectly accessible by the computer.

Whether contained in the diskette, the computer, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog communication links and wireless. In an illustrative embodiment of the invention, the machine-readable instructions may comprise software object code, compiled from a suitable language.

While the invention has been described in terms of preferred embodiments, those skilled in the art will recognize that the invention can be practiced with modification within the spirit and scope of the appended claims.

For example, instead of first determining a timing margin for all paths by first using a low voltage bus and then changing those paths not meeting the delay margin to a high voltage bus, the invention would be equally beneficial if the timing margin for all paths was determined by using high voltage and then substituting a low voltage bus for non-critical paths. This would especially be useful for a high performance part in which a power savings was desired.

Further, while the load devices have been described as typically being PFET load devices, it is envisioned that other devices also may find great benefit with the invention.

What is claimed is:

1. A method for designing a circuit, comprising:
   identifying paths in the circuit not satisfying a preselected performance criteria, wherein identified paths are initially designed to be coupled to a first power supply; and
   redesigning the circuit such that the identified paths are coupled to a second power supply having a higher voltage than the first power supply,
   wherein the higher voltage increases performance of the identified paths such that the identified paths satisfy the performance criteria.

2. The method according to claim 1, wherein said performance criteria includes a timing margin criteria.

3. The method according to claim 1, wherein said redesigning includes changing a granularity of logic paths of said paths in said circuit.

4. The method according to claim 2, wherein said redesigning includes changing a granularity of logic paths of said paths in said circuit.

5. An apparatus for designing a circuit, comprising:
   means for identifying paths in the circuit not satisfying a preselected performance criteria, wherein identified paths are initially designed to be coupled to a first power supply; and
   means for redesigning the circuit such that the identified paths are coupled to a second power supply having a higher voltage than the first power supply,
   wherein the higher voltage increases performance of the identified paths such that the identified paths satisfy the performance criteria.

6. The apparatus according to claim 5, wherein said performance criteria includes a timing margin criteria.

7. The apparatus according to claim 5, wherein said means for redesigning includes means for changing a granularity of logic paths of said paths in said circuit.

8. The apparatus according to claim 2, wherein said means for redesigning includes means for changing a granularity of logic paths of said paths in said circuit.

9. A method of optimizing performance and minimizing power dissipation of a plurality of integrated circuits, comprising:
   simulating the integrated circuits by wiring said integrated circuits with a first voltage power supply;
   identifying paths between said integrated circuits not meeting a delay margin criteria;
   wiring integrated circuits having paths not meeting said delay margin criteria with a second voltage power supply;
   determining and increasing a magnitude of load threshold voltages of all second voltage circuits having input signals emanating from first voltage bus circuits; and
   re-simulating the integrated circuits and determining whether all logic paths meet said delay margin criteria and power criteria.

10. The method according to claim 9, further comprising:

for said logic paths not meeting said power criteria, using finer granularity of logic paths to isolate slow circuit paths; and repeating said simulating, identifying, wiring, determining, and re-simulating steps.

11. The method according to claim 10, further comprising:

performing a logical-to-physical translation of the integrated circuit topology for creating a high load threshold adjust mask.

12. The method according to claim 9, wherein said second voltage is higher than said first voltage.

13. The method according to claim 9, wherein said load threshold voltage comprises a P-type field effect transistor (PFET) load threshold voltage.

14. A system for optimizing performance and minimizing power dissipation of a plurality of integrated circuits, comprising:

means for simulating the integrated circuits by wiring said integrated circuits with a first voltage power supply;

means for identifying paths between said integrated circuits not meeting a delay margin criteria;

means for wiring integrated circuits having paths not meeting said delay margin criteria with a second voltage power supply;

means for determining and increasing a magnitude of load threshold voltages of all second voltage circuits having input signals emanating from first voltage bus circuits; and means for re-simulating the integrated circuits and determining whether all logic paths meet said delay margin criteria and power criteria.

15. The method according to claim 14, further comprising:

for said logic paths not meeting said power criteria, using finer granularity of logic paths to isolate slow circuit paths; and repeating said simulating, identifying, wiring, determining, and re-simulating steps.

16. The method according to claim 15, further comprising:

performing a logical-to-physical translation of the integrated circuit topology for creating a high load threshold adjust mask.

17. The method according to claim 14, wherein said second voltage is higher than said first voltage.

18. The method according to claim 14, wherein said load threshold voltage comprises a P-type field effect transistor (PFET) load threshold voltage.

19. A program storage device readable by machine, tangibly embodying a program of instructions executable by the machine, to perform method steps for designing a circuit, said method steps comprising:

identifying paths in the circuit not satisfying preselected performance criteria, wherein the identified paths are initially designed to be coupled to a first power supply; and redesigning the circuit such that identified paths are coupled to a second power supply having a higher voltage than the first power supply, wherein the higher voltage increases performance of the identified paths such that the identified paths satisfy the performance criteria.

* * * * *